(12) United States Patent
Satou et al.

(10) Patent No.: US 8,168,731 B2
(45) Date of Patent: May 1, 2012

(54) CURABLE RESIN COMPOSITION, CURED PRODUCT THEREOF, PRINTED WIRING BOARD, EPOXY RESIN, AND PROCESS FOR PRODUCING THE SAME

(75) Inventors: Yutaka Satou, Ichihara (JP); Kazuo Arita, Ichihara (JP); Ichirou Ogura, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/124,694

(22) PCT Filed: Aug. 7, 2009

(86) PCT No.: PCT/JP2009/064024
§ 371 (c)(1),
(2), (4) Date: Jul. 11, 2011

(87) PCT Pub. No.: WO2010/047169
PCT Pub. Date: Apr. 29, 2010

(65) Prior Publication Data
US 2011/0259628 A1   Oct. 27, 2011

(30) Foreign Application Priority Data

Oct. 22, 2008   (JP) .................................. 2008-271898

(51) Int. Cl.
*B32B 27/04*   (2006.01)
*C08L 63/00*   (2006.01)
*H05K 1/03*   (2006.01)

(52) U.S. Cl. ................. 525/481; 428/301.1; 525/423; 525/523; 525/524; 525/533; 174/255

(58) Field of Classification Search ................. None
See application file for complete search history.

(56) References Cited

U.S. PATENT DOCUMENTS 5,302,672 A * 4/1994 Ogura et al. .................. 525/481

FOREIGN PATENT DOCUMENTS

| JP | 3137202 B2 | 8/1992 |
| JP | 05-025248 A | 2/1993 |
| JP | 05-032760 A | 2/1993 |
| JP | 05-093036 A | 4/1993 |
| JP | 05-186547 A | 7/1993 |
| JP | 2000-103941 A | 4/2000 |
| JP | 2000-336248 A | 12/2000 |
| JP | 2005-097352 A | 4/2005 |

* cited by examiner

*Primary Examiner* — Robert Sellers
(74) *Attorney, Agent, or Firm* — Edwards Wildman Palmer LLP

(57) ABSTRACT

Provided is a curable resin composition that exhibits good heat resistance and low thermal expansion, and that realizes good solubility in solvents, a cured product thereof, a printed wiring board including the composition, a novel epoxy resin that imparts these properties, and a process for producing the same. A curable resin composition contains, as essential components, an epoxy resin (A) having, in its molecular structure, a glycidyloxy group and a skeleton in which a naphthalene structure and a cyclohexadienone structure are bonded to each other via methylene group(s); and a curing agent (B).

18 Claims, 5 Drawing Sheets

CURABLE RESIN COMPOSITION, CURED PRODUCT THEREOF, PRINTED WIRING BOARD, EPOXY RESIN, AND PROCESS FOR PRODUCING THE SAME

TECHNICAL FIELD

The present invention relates to a curable resin composition whose cured product has good heat resistance and low thermal expansion and which can be suitably used for applications to a printed wiring board, a semiconductor sealing material, a coating material, cast molding, and the like, a cured product thereof, a novel epoxy resin, a process for producing the same, and a printed wiring board that is good in terms of heat resistance and low thermal expansion.

BACKGROUND ART

Epoxy resins are used as an adhesive, a molding material, a coating material, a photoresist material, a color developer, etc. In addition, epoxy resins are widely used in the electric/electronic fields such as a semiconductor sealing material and an insulating material for a printed wiring board from the standpoint of good heat resistance, moisture resistance, and the like of the resulting cured products.

Among these various applications, in the field of printed wiring boards, with a trend of a reduction in the size and an increase in the performance of electronic devices, a trend of realizing a high density by reducing the wiring pitch of semiconductor devices has been significant. As a semiconductor packaging method for meeting this trend, a flip-chip connection method in which a semiconductor device is bonded to a substrate with solder balls is widely used. This flip-chip connection method is a semiconductor packaging method using a so-called reflow process in which solder balls are arranged between a wiring board and a semiconductor, and fusion bonding is performed by heating the whole components. Accordingly, during the solder reflow, the wiring board itself is exposed to a high-heat environment, and a large stress is generated, by thermal contraction of the wiring board, in the solder balls connecting the wiring board to the semiconductor, which may result in connection failure of wiring. Therefore, a material having a low coefficient of thermal expansion has been desired for an insulating material used as a printed wiring board.

In addition, recently, lead-free high-melting point solder has been widely used because of, for example, regulations associated with environmental issues. This lead-free solder is used at a temperature about 20° C. to 40° C. higher than the temperature used for existing eutectic solder. Thus, a heat resistance higher than ever before is required for curable resin compositions.

As described above, high heat resistance and low thermal expansion have been desired for insulating materials for printed wiring boards. As an epoxy resin material that can meet such requirements, for example, a tetrafunctional naphthalene epoxy resin represented by the structural formula below is known (refer to PTL 1 below).

[Chem. 1]

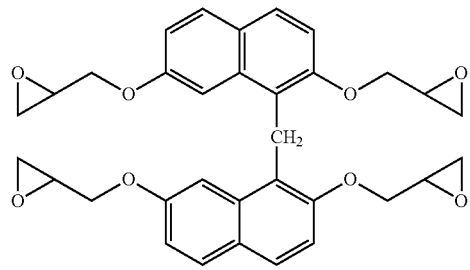

The above tetrafunctional naphthalene epoxy resin has a crosslinking density higher than that of general phenol novolac-type epoxy resins, and thus good low thermal linear expansion and heat resistance are exhibited in cured products of the epoxy resin. However, recently, higher performance has been required, and it has been necessary to achieve a further improvement. Furthermore, since the tetrafunctional naphthalene epoxy resin has low solubility in solvents that are generally used in the production of printed wiring boards, characteristics of resulting cured products are not sufficiently exhibited.

CITATION LIST

Patent Literature

PTL 1: Japanese Patent No. 3137202

SUMMARY OF INVENTION

Technical Problem

Accordingly, an object to be achieved by the present invention is to provide a curable resin composition that exhibits good heat resistance and low thermal expansion and that realizes good solubility in solvents, a cured product thereof, a printed wiring board that is good in terms of heat resistance and low thermal expansion, an epoxy resin that imparts these properties, and a process for producing the same.

Solution to Problem

In order to achieve the above object, the inventors of the present invention conducted intensive studies. As a result, it was found that an epoxy resin having a carbonyl group, the epoxy resin being obtained by allowing a 2,7-dihydroxynaphthalene type compound to react with formaldehyde under a specific condition, and then allowing the resulting reaction product to react with epichlorohydrin, exhibits good heat resistance and low thermal expansion, and has good solubility in solvents. This finding resulted in the completion of the present invention.

Specifically, the present invention relates to a curable resin composition containing, as essential components, an epoxy resin (A) having, in its molecular structure, a glycidyloxy group and a skeleton in which a naphthalene structure and a cyclohexadienone structure are bonded to each other via methylene group(s); and a curing agent (B).

The present invention further relates to a cured product obtained by conducting a curing reaction of the above curable resin composition.

The present invention further relates to a printed wiring board obtained by impregnating a glass woven cloth with a resin composition containing, as essential components, an epoxy resin (A) having, in its molecular structure, a glycidyloxy group and a skeleton in which a naphthalene structure and a cyclohexadienone structure are bonded to each other via methylene group(s), a curing agent (B), and an organic solvent (C), laminating a copper foil, and performing thermocompression bonding.

The present invention further relates to an epoxy resin having, in its molecular structure, a glycidyloxy group and a skeleton in which a naphthalene structure and a cyclohexadienone structure are bonded to each other via methylene group(s).

The present invention further relates to an epoxy resin having a molecular structure obtained by allowing a 2,7-dihydroxynaphthalene type compound to react with formaldehyde in the presence of an alkali catalyst in an amount 0.2 to 2.0 times the 2,7-dihydroxynaphthalene type compound on a molar basis, and then allowing an epihalohydrin to react with the resulting reaction product.

The present invention further relates to a process for producing an epoxy resin including allowing a 2,7-dihydroxynaphthalene type compound to react with formaldehyde in the presence of an alkali catalyst in an amount 0.2 to 2.0 times the 2,7-dihydroxynaphthalene type compound on a molar basis, and then allowing an epihalohydrin to react with the resulting reaction product.

Advantageous Effects of Invention

According to the present invention, it is possible to provide a curable resin composition that exhibits good heat resistance and low thermal expansion, and that realizes good solubility in solvents, a cured product thereof, a printed wiring board that is good in terms of heat resistance and low thermal expansion, an epoxy resin that imparts these properties, and a process for producing the same.

DESCRIPTION OF EMBODIMENTS

Figure 1:
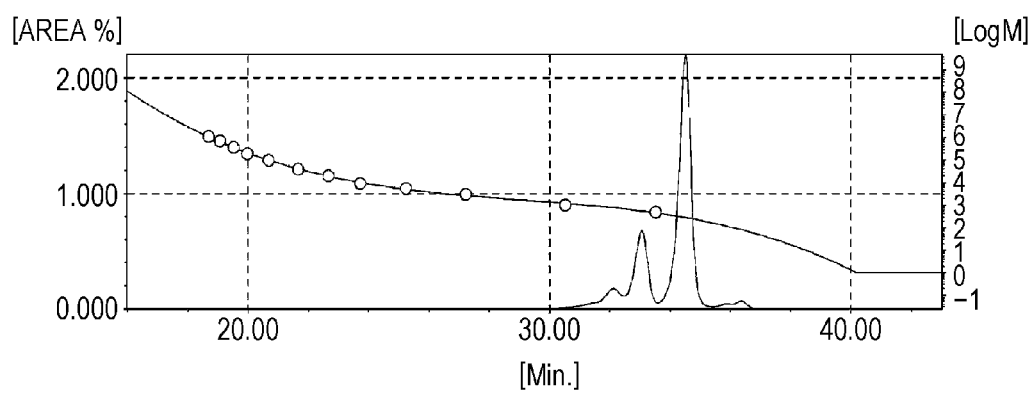
FIG. 1 is a gel permeation chromatography (GPC) chart of a phenolic compound obtained in Example 1.

The present invention will now be described in detail.

An epoxy resin (A) used in the present invention is characterized in that the epoxy resin (A) has, in its molecular structure, a glycidyloxy group and a skeleton in which a naphthalene structure and a cyclohexadienone structure are bonded to each other via methylene group(s). That is, since the epoxy resin (A) has, in its molecule, a skeleton in which a naphthalene structure and a cyclohexadienone structure are bonded to each other via methylene group(s), good solubility in solvents can be exhibited on the basis of the chemical structural asymmetry of the epoxy resin (A). Furthermore, in a curing reaction between an epoxy group and a curing agent, the cyclohexadienone structure is involved in the curing reaction, whereby a strong cured product is obtained and heat resistance and low thermal expansion in the cured product are improved.

Herein, specifically, examples of the cyclohexadienone structure include 2,4-cyclohexadienone structures represented by structural formulae k1 and k2 below:

[Chem. 2]

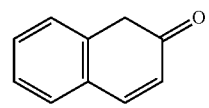

k1

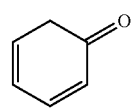

k2 and a 2,5-cyclohexadienone structure represented by structural formula k3 below:

[Chem. 3]

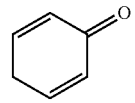

k3

Among these structures, the 2,4-cyclohexadienone structures represented by structural formulae k1 and k2 above are preferable from the standpoint of significantly good heat resistance and low thermal expansion, and in particular, a 2-naphthalenone structure represented by structural formula k1 above is preferable.

The epoxy resin (A) can be produced by a process in which a 2,7-dihydroxynaphthalene type compound is allowed to react with formaldehyde in the presence of an alkali catalyst, and the resulting reaction product is then allowed to react with an epihalohydrin (process 1) or a process in which a 2,7-dihydroxynaphthalene type compound, formaldehyde, and a phenol are allowed to react with each other in the presence of an alkali catalyst, and the resulting reaction product is then allowed to react with an epihalohydrin (process 2), and can include epoxy resins having various molecular structures. Specifically, the epoxy resin (A) preferably contains a compound (a) having, as a basic skeleton, a structure in which a naphthalene structure and a cyclohexadienone structure represented by structural formula k1 or k2 above are bonded to each other via methylene group(s) and having a glycidyloxy group as a substituent on the aromatic nucleus of the basic skeleton.

Specifically, examples of the compound (a) include compounds represented by structural formulae (i) to (iii) below:

[Chem. 4]
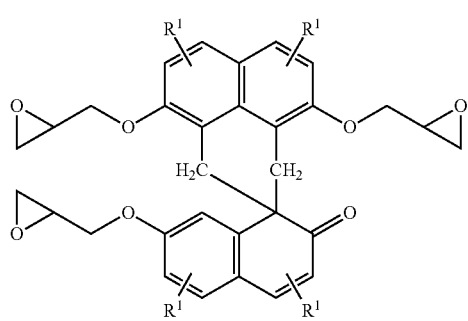
(i)
[Chem. 5]
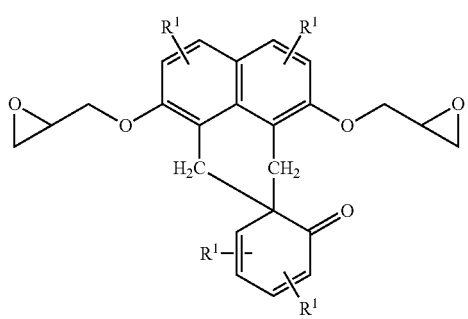
(ii)
[Chem. 6]
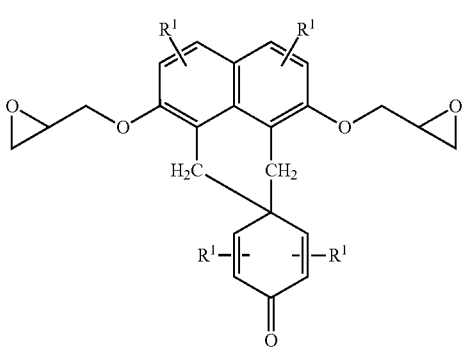
(iii)
In structural formulae (i) to (iii) above, $R^1$s each independently represent a hydrogen atom, a hydrocarbon group having 1 to 4 carbon atoms, or an alkoxy group having 1 to 4 carbon atoms. Specifically, examples of the compounds represented by structural formula (i) above include compounds represented by i-1 to i-8 below.
[Chem. 7]
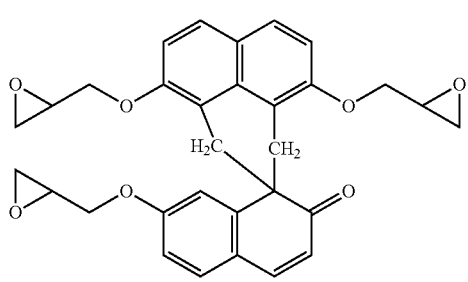
i-1
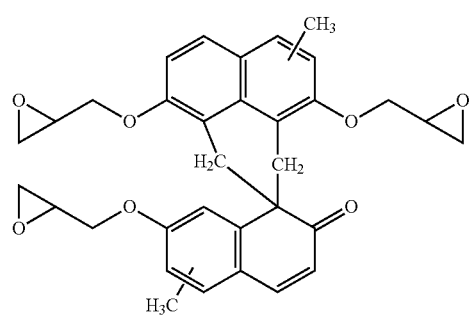
i-2
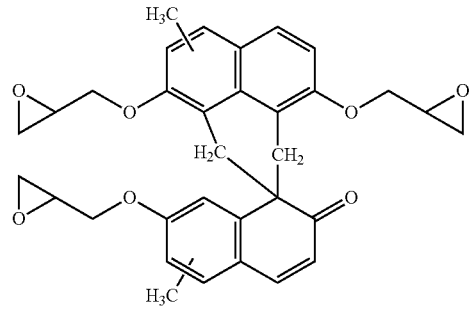
i-3
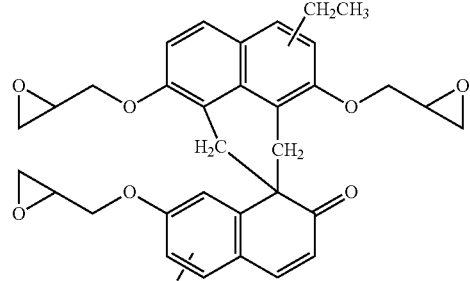
i-4
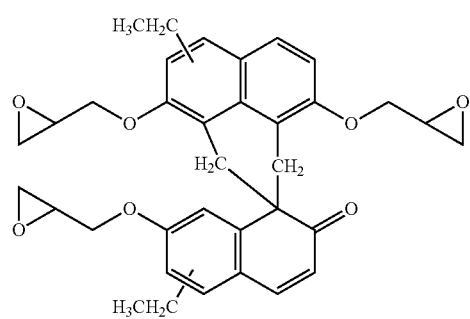
i-5
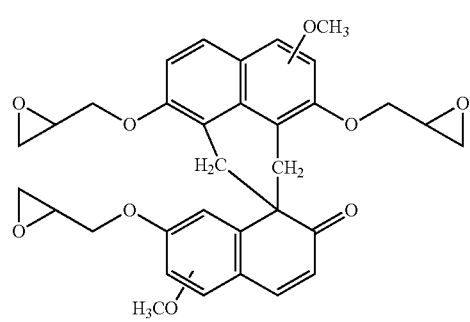
i-6 i-7
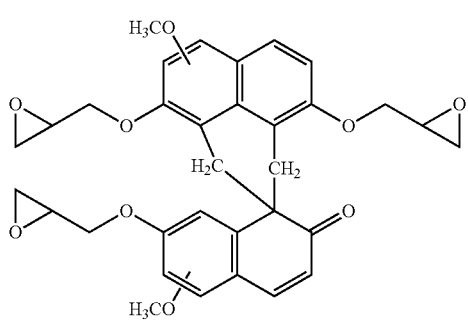
i-8
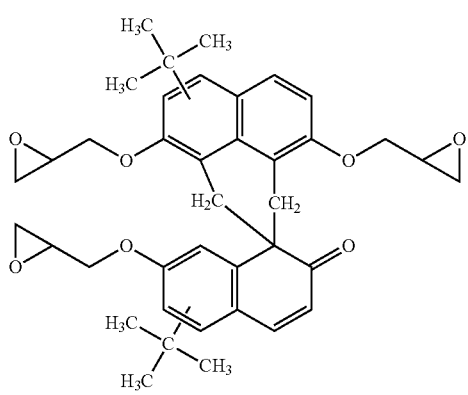
Examples of the compounds represented by structural formula (ii) above include compounds represented by ii-1 to ii-8 below.
[Chem. 8]
ii-1
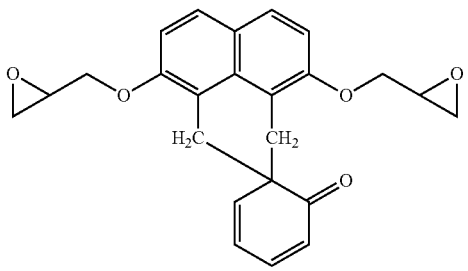
ii-2
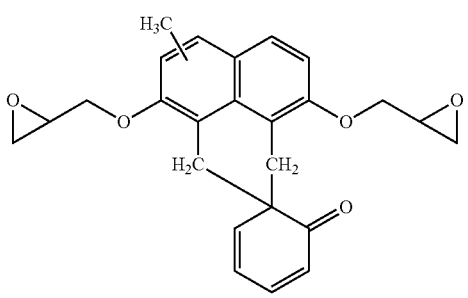
ii-3
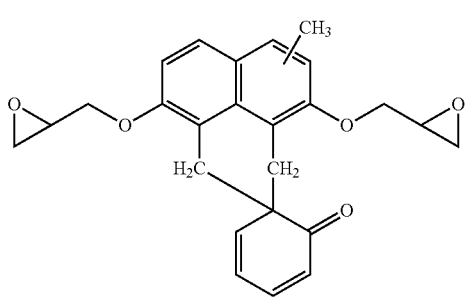
ii-4
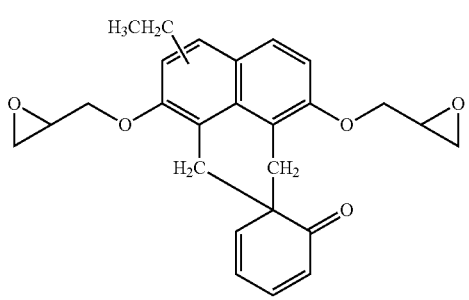
ii-5
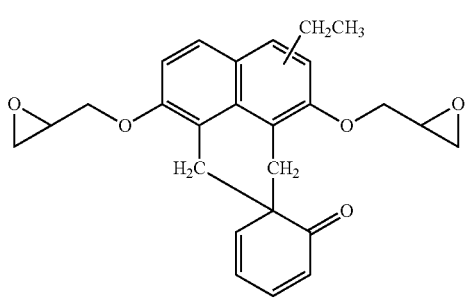
ii-6
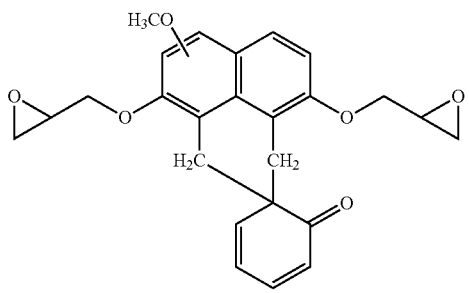
ii-7
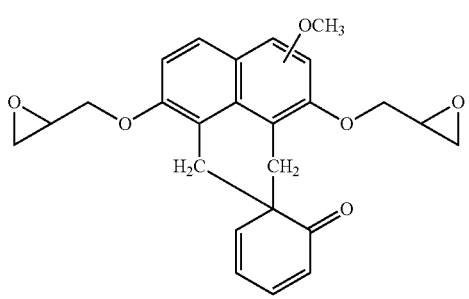

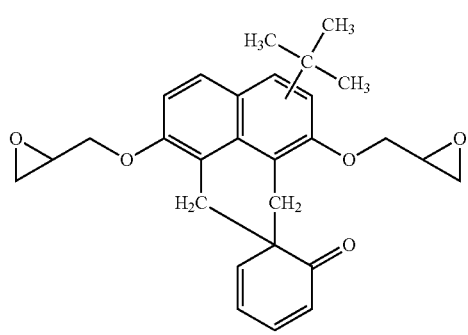
ii-8
Examples of the compounds represented by structural formula (iii) above include compounds represented by iii-1 to iii-8 below.
[Chem. 9]
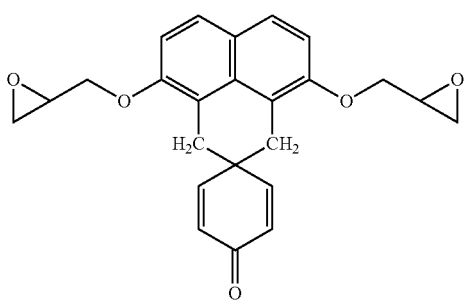
iii-1
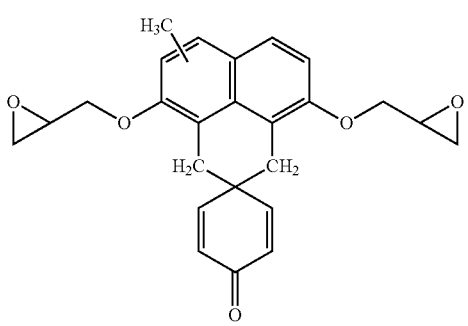
iii-2
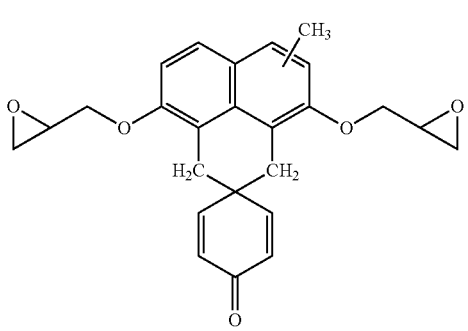
iii-3
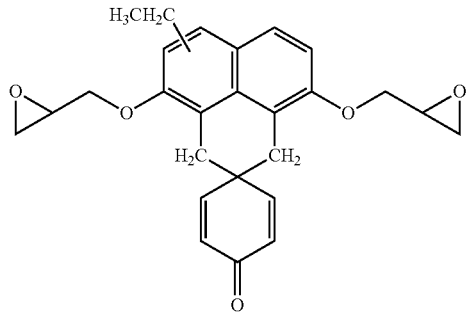
iii-4
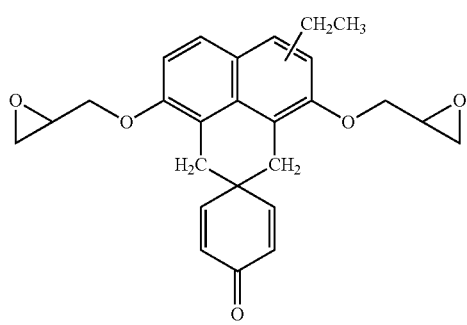
iii-5
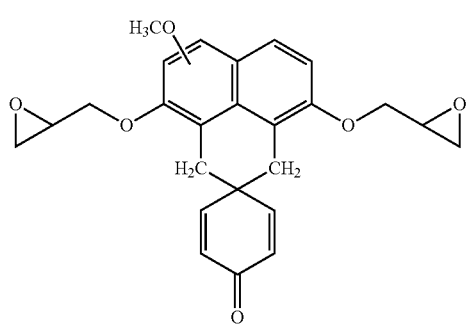
iii-6
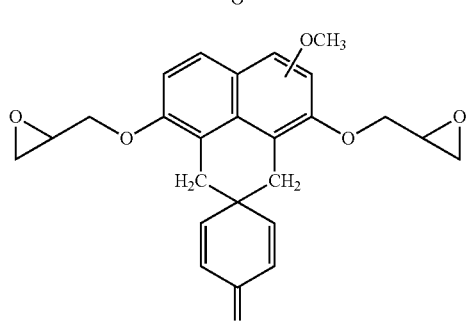
iii-7
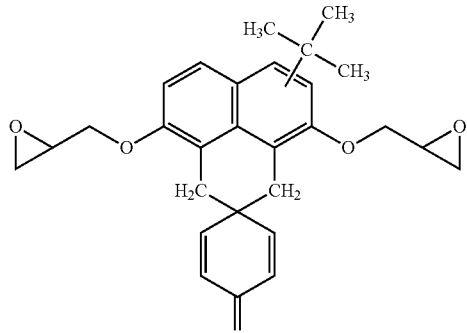
iii-8

Among these compounds, the compound represented by structural formula (i) below:

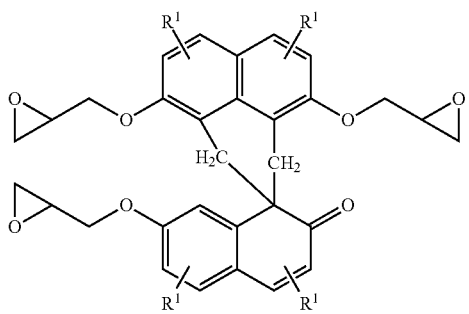

[Chem. 10]

(i)

(wherein $R^1$s each independently represent a hydrogen atom, a hydrocarbon group having 1 to 4 carbon atoms, or an alkoxy group having 1 to 4 carbon atoms) is particularly preferable from the standpoint of significantly good heat resistance and low thermal expansion. As described above, the compound represented by structural formula (i) above has a cyclohexadienone structure in its molecule. Accordingly, the compound is asymmetric in terms of the chemical structure and can exhibit good solubility in solvents. In addition, since the cyclohexadienone structure itself contributes to a curing reaction with a curing agent (B), the compound represented by structural formula (i) above can exhibit good heat resistance and low thermal expansion though the compound is a trifunctional epoxy resin.

In the present invention, among these, from the standpoint of particularly high heat resistance, the compound (a) preferably has a structure represented by structural formula (i-α) below:

[Chem. 11]

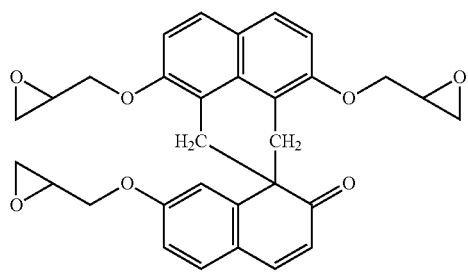

(i-α)

in which $R_1$s in structural formula (i) are each a hydrogen atom.

When the epoxy resin (A) described in detail above is produced by the above process 1 or process 2, in general, in addition to the compound (a), a compound (b) represented by structural formula (iv) below:

[Chem. 12]

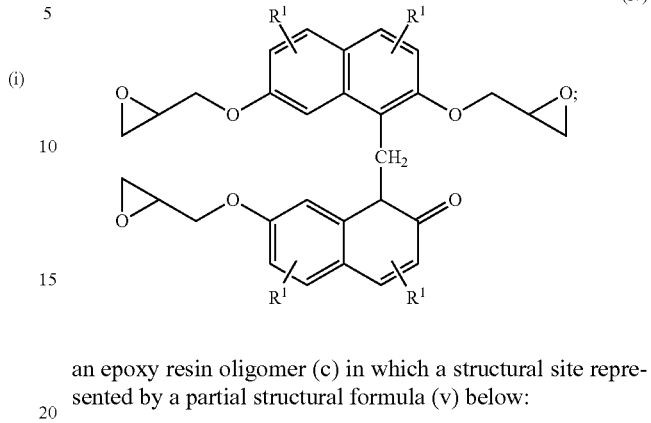

(iv)

an epoxy resin oligomer (c) in which a structural site represented by a partial structural formula (v) below:

[Chem. 13]

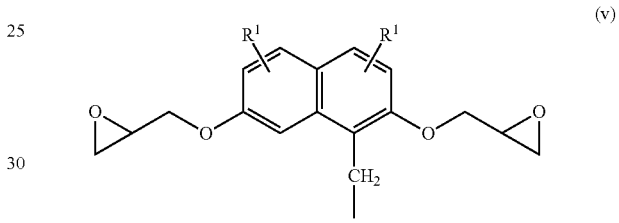

(v)

is further bonded to the aromatic nucleus in structural formula (i), structural formula (ii), or structural formula (iii) above; and furthermore, an oligomer (d) that is produced when an epihalohydrin is allowed to react in the process 1 or the process 2 are also produced. Accordingly, the epoxy resin (A) of the present invention may be used as a mixture of these.

In this case, the epoxy resin (A) preferably contains the compound (a) in an amount of 5.0% to 20.0% by mass. Specifically, the epoxy resin (A) preferably contains the compound (a) in an amount of 5.0% to 20.0% by mass, the compound (b) in an amount of 15.0% to 50.0% by mass, and an oligomer component typified by the oligomer (c) or the oligomer (d) in an amount of 30% to 80% by mass from the standpoint of good solubility in solvents.

In addition, from the standpoint that good heat resistance and low thermal expansion can be achieved, the epoxy equivalent in the epoxy resin (A) is preferably in the range of 150 to 300 g/eq, and particularly preferably in the range of 155 to 250 g/eq.

As described above, the epoxy resin (A) can be produced by the process 1 or the process 2, but the present invention is characterized in that the amount of alkali catalyst is larger than that in the production of existing compounds. Specifically, the skeleton in which a naphthalene structure and a cyclohexadienone structure are bonded to each other via methylene group(s) can be produced in the molecular structure by using an alkali catalyst, on a molar basis, 0.2 to 2.0 times the number of moles of a 2,7-dihydroxynaphthalene type compound or the total number of moles of a 2,7-dihydroxynaphthalene type compound and a phenol. In contrast, a compound represented by structural formula (2) below:

[Chem. 14]

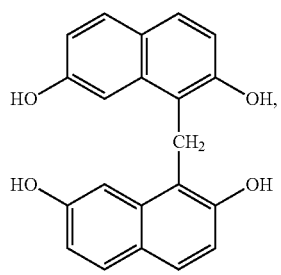

(2)

which is a known compound, can be produced by allowing 2,7-dihydroxynaphthalene type compound to react with formaldehyde using an alkali catalyst in an amount 0.01 to 0.1 times the amount of 2,7-dihydroxynaphthalene type compound on a molar basis. However, in such an amount of the catalyst, during the production process, the compound represented by structural formula (2) is selectively produced and precipitated, and the reaction is then terminated. Therefore, unlike the present invention, a cyclohexadienone structure is not produced.

Herein, examples of the 2,7-dihydroxynaphthalene type compound used in the process 1 or the process 2 include 2,7-dihydroxynaphthalene, methyl-2,7-dihydroxynaphthalene, ethyl-2,7-dihydroxynaphthalene, tert-butyl-2,7-dihydroxynaphthalene, methoxy-2,7-dihydroxynaphthalene, and ethoxy-2,7-dihydroxynaphthalene.

The formaldehyde used in the process 1 or the process 2 may be a formalin solution, which is in the state of an aqueous solution, or paraformaldehyde, which is in the state of a solid.

Examples of the phenol used in the process 2 include phenol, o-cresol, p-cresol, and 2,4-xylenol.

Examples of the alkali catalyst used in the process 1 or the process 2 include alkali metal hydroxides such as sodium hydroxide and potassium hydroxide; and inorganic alkalis such as metallic sodium, metallic lithium, sodium hydride, sodium carbonate, and potassium carbonate.

As described above, in the present invention, among the compounds (a), the compound represented by structural formula (i) above is preferable. Accordingly, of the above-described processes, the production process of the process 1 is preferable. The process 1 will now be described in detail.

Specifically, examples of the process 1 include a process in which a 2,7-dihydroxynaphthalene type compound and formaldehyde are charged substantially at the same time, and a reaction is conducted by stirring under heating in the presence of an appropriate catalyst, and a process in which a reaction is conducted by continuously or intermittently adding formaldehyde to a reaction system of a mixed liquid containing a 2,7-dihydroxynaphthalene type compound and an appropriate catalyst. Note that, herein, the phrase "substantially at the same time" means that all the raw materials are charged until the reaction is accelerated by heating.

Examples of the alkali catalyst used here include alkali metal hydroxides such as sodium hydroxide and potassium hydroxide; and inorganic alkalis such as metallic sodium, metallic lithium, sodium hydride, sodium carbonate, and potassium carbonate. As described above, the amount of use thereof is preferably in the range of 0.2 to 2.0 times the number of moles of the 2,7-dihydroxynaphthalene type compound on a molar basis.

The reaction charging ratio of formaldehyde to the 2,7-dihydroxynaphthalene type compound is not particularly limited. However, the amount of formaldehyde is preferably 0.6 to 2.0, in particular, from the standpoint of a good balance between heat resistance and the viscosity of the epoxy resin, 0.6 to 1.5 times the amount of 2,7-dihydroxynaphthalene type compound on a molar basis.

In conducting this reaction, an organic solvent may be used as required. Examples of the organic solvent that can be used include, but are not limited to, methyl cellosolve, isopropyl alcohol, ethyl cellosolve, toluene, xylene, and methyl isobutyl ketone. The amount of organic solvent used is usually in the range of 0.1 to 5 times, particularly preferably, in the range of 0.3 to 2.5 times the total mass of the charging raw materials from the standpoint that the structure represented by structural formula (i) is efficiently obtained. The reaction temperature is preferably in the range of 20° C. to 150° C., and in particular, more preferably in the range of 60° C. to 100° C. The reaction time is not particularly limited, but is usually in the range of 1 to 10 hours.

After the completion of the reaction, a neutralization process or a water washing process is conducted until the pH of the reaction mixture becomes in the range of 4 to 7. The neutralization process or the water washing process can be conducted in accordance with conventional process. For example, when an alkali catalyst is used, an acidic substance such as acetic acid, phosphoric acid, or sodium phosphate can be used as a neutralizing agent. After the neutralization process or the water washing process is conducted, the organic solvent is distilled off by heating under reduced pressure to concentrate the resulting product. Thus, a carbonyl group-containing phenolic compound can be obtained. Furthermore, from the standpoint that inorganic salts and foreign matters can be removed by purification, a microfiltration step is more preferably introduced to the process operations performed after the completion of the reaction.

Next, the resulting phenolic compound is allowed to react with an epihalohydrin, thereby obtaining a target epoxy resin (A). Specifically, an example of the process is as follows: The phenolic compound is allowed to react with an epihalohydrin by adding the epihalohydrin in an amount 2 to 10 times (on a molar basis) the number of moles of the phenolic hydroxyl group in the phenolic compound, and further adding a basic catalyst either at one time or gradually in an amount 0.9 to 2.0 times (on a molar basis) the number of moles of the phenolic hydroxyl group at a temperature in the range of 20° C. to 120° C. for 0.5 to 10 hours. This basic catalyst may be used either in the form of a solid or in the form of an aqueous solution thereof. When an aqueous solution is used, a process may be employed in which the aqueous solution is continuously added, water and the epihalohydrin are continuously distilled from the reaction mixture under reduced pressure or normal pressure, and a separation of liquid is further conducted so that water is removed and the epihalohydrin is continuously returned to the reaction mixture.

When industrial production is performed, in a first batch of the production of the epoxy resin, all of the epihalohydrin used in charging is virgin epihalohydrin. However, in subsequent batches, the epihalohydrin recovered from a crude reaction product and virgin epihalohydrin that compensates for the amount that has disappeared by being consumed by the reaction are preferably used in combination. In this case, examples of the epihalohydrin used include, but are not particularly limited to, epichlorohydrin, epibromohydrin, and β-methylepichlorohydrin. Among these, epichlorohydrin is preferable from the standpoint of the ease of industrial availability.

Specifically, examples of the basic catalyst include alkaline earth metal hydroxides, alkali metal carbonates, and alkali metal hydroxides. In particular, from the standpoint of high catalytic activity of an epoxy resin synthesis reaction, alkali metal hydroxides are preferable. Examples thereof include sodium hydroxide and potassium hydroxide. In using the basic catalyst, these basic catalysts may be used either in the form of an aqueous solution with a concentration of about 10% to 55% by mass or in the form of a solid. Furthermore, the reaction rate in the synthesis of the epoxy resin can be increased by using an organic solvent in combination. Examples of the organic solvent include, but are not particularly limited to, ketones such as acetone and methyl ethyl ketone; alcohols such as methanol, ethanol, 1-propyl alcohol, isopropyl alcohol, 1-butanol, secondary butanol, and tertiary butanol; cellosolves such as methyl cellosolve and ethyl cellosolve; ethers such as tetrahydrofuran, 1,4-dioxane, 1,3-dioxane, and diethoxyethane; and aprotic polar solvents such as acetonitrile, dimethyl sulfoxide, and dimethylformamide. These organic solvents may be used alone or appropriately in combination of two or more solvents in order to adjust the polarity.

After the above-described reaction product of the epoxidation reaction is washed with water, distillation is performed by heating under reduced pressure so that unreacted epihalohydrin and the organic solvent used in combination are distilled off. In addition, in order to produce an epoxy resin that contains a smaller amount of hydrolyzable halogen, the resulting epoxy resin may be again dissolved in an organic solvent such as toluene, methyl isobutyl ketone, or methyl ethyl ketone, and an aqueous solution of an alkali metal hydroxide such as sodium hydroxide or potassium hydroxide may be added to the resulting solution to further conduct a reaction. In this case, in order to improve the reaction rate, the reaction may be conducted in the presence of a phase-transfer catalyst such as a quaternary ammonium salt or a crown ether. When the phase-transfer catalyst is used, the amount used is preferably 0.1 to 3.0 parts by mass relative to 100 parts by mass of the epoxy resin used. After the completion of the reaction, the resulting salt is removed by, for example, filtering and washing with water, and the solvent such as toluene or methyl isobutyl ketone is further distilled off by heating under reduced pressure. Thus, the epoxy resin (A) containing the target compound (a) can be obtained.

In the curable resin composition of the present invention, the epoxy resin (A) may be used alone or other epoxy resins may be used so long as the advantages of the present invention are not impaired. Specifically, the other epoxy resins can be used in combination so that the amount of the epoxy resin (A) is 30% by mass or more, preferably 40% by mass or more of the total mass of the epoxy resin components.

Various epoxy resins can be used as the other epoxy resins that can be used in combination with the epoxy resin (A). Examples thereof include bisphenol A-type epoxy resins, bisphenol F-type epoxy resins, biphenyl-type epoxy resins, tetramethylbiphenyl-type epoxy resins, phenol novolac-type epoxy resins, cresol novolac-type epoxy resins, bisphenol A novolac-type epoxy resins, triphenylmethane-type epoxy resins, tetraphenylethane-type epoxy resins, dicyclopentadiene-phenol addition reaction-type epoxy resins, phenol aralkyl-type epoxy resins, naphthol novolac-type epoxy resins, naphthol aralkyl-type epoxy resin, naphthol-phenol co-condensed novolac-type epoxy resins, naphthol-cresol co-condensed novolac-type epoxy resins, aromatic hydrocarbon-formaldehyde resin-modified phenolic resin-type epoxy resins, and biphenyl novolac-type epoxy resins. Among these, phenol aralkyl-type epoxy resins; biphenyl novolac-type epoxy resins; naphthol novolac-type epoxy resins, naphthol aralkyl-type epoxy resin, naphthol-phenol co-condensed novolac-type epoxy resins, and naphthol-cresol co-condensed novolac-type epoxy resins, all of which have a naphthalene skeleton; crystalline biphenyl-type epoxy resins; tetramethylbiphenyl-type epoxy resins; xanthene-type epoxy resins; and alkoxy group-containing aromatic ring-modified novolac-type epoxy resins (compounds in which a glycidyl group-containing aromatic ring and an alkoxy group-containing aromatic ring are connected by formaldehyde) are particularly preferable from the standpoint of obtaining a cured product having good heat resistance.

Examples of the curing agent (B) used in the curable resin composition of the present invention include amine compounds, amide compounds, acid anhydride compounds, and phenolic compounds. Specifically, examples of the amine compounds include diaminodiphenylmethane, diethylenetriamine, triethylenetetramine, diaminodiphenyl sulfone, isophoronediamine, imidazoles, $BF_3$-amine complexes, and guanidine derivatives. Specific examples of the amide compounds include dicyandiamide, and polyamide resins synthesized from a dimer of linolenic acid and ethylenediamine. Specific examples of the acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride. Specific examples of the phenolic compounds include phenol novolac resins, cresol novolac resins, aromatic hydrocarbon-formaldehyde resin-modified phenolic resins, dicyclopentadiene-phenol addition type resins, phenol aralkyl resins (xylok resins), naphthol aralkyl resins, trimethylolmethane resins, tetraphenylolethane resins, naphthol novolac resins, naphthol-phenol co-condensed novolac resins, naphthol-cresol co-condensed novolac resins, and polyvalent phenolic compounds such as biphenyl-modified phenolic resins (polyvalent phenolic compounds in which phenolic nuclei are connected by a bismethylene group), biphenyl-modified naphthol resins (polyvalent naphthol compounds in which phenolic nuclei are connected by a bismethylene group), aminotriazine-modified phenolic resins (polyvalent phenolic compounds in which phenolic nuclei are connected by melamine, benzoguanamine, or the like), and alkoxy group-containing aromatic ring-modified novolac resins (polyvalent phenolic compounds in which a phenolic nucleus and an alkoxy group-containing aromatic ring are connected by formaldehyde).

Among these, in particular, compounds having a large number of aromatic skeletons in the molecular structure are preferable from the standpoint of low thermal expansion. Specifically, phenol novolac resins, cresol novolac resins, aromatic hydrocarbon-formaldehyde resin-modified phenolic resins, phenol aralkyl resins, naphthol aralkyl resins, naphthol novolac resins, naphthol-phenol co-condensed novolac resins, naphthol-cresol co-condensed novolac resins, biphenyl-modified phenolic resins, biphenyl-modified naphthol resins, aminotriazine-modified phenolic resins, and alkoxy group-containing aromatic ring-modified novolac resins (polyvalent phenolic compounds in which a phenolic nucleus and an alkoxy group-containing aromatic ring are connected by formaldehyde) are preferable because these compounds are good in terms of low thermal expansion.

The blending ratio of the epoxy resin (A) and the curing agent (B) in the curable resin composition of the present invention is not particularly limited. However, from the standpoint that characteristics of the resulting cured product are good, the amount of an active group in the curing agent (B) is preferably 0.7 to 1.5 equivalents relative to the total 1 equivalent of the epoxy group of the epoxy resin (A).

In addition, a curing accelerator may be appropriately used in combination with the curable resin composition of the present invention, as required. Various types of compounds can be used as the curing accelerator. Examples of the curing accelerator include phosphorus compounds, tertiary amines, imidazoles, organic acid metal salts, Lewis acids, and amine complex salts. In particular, when the curable resin composition is used in the application of semiconductor-sealing materials, among the phosphorous compounds, triphenylphosphine is preferable, and among the tertiary amines, 1,8-diazabicyclo-[5.4.0]-undecene (DBU) is preferable from the standpoint of good curability, heat resistance, electrical properties, moisture resistance reliability etc.

As described above, the curable resin composition of the present invention described in detail above has a feature that the curable resin composition exhibits good solubility in solvents. Accordingly, the curable resin composition preferably contains an organic solvent (C) in addition to the components described above. Examples of the organic solvent (C) that can be used here include methyl ethyl ketone, acetone, dimethylformamide, methyl isobutyl ketone, methoxy propanol, cyclohexanone, methyl cellosolve, ethyl diglycol acetate, and propylene glycol monomethyl ether acetate. The selection and a proper amount of the organic solvent used can be appropriately selected depending on the applications. For example, in the application of printed wiring boards, polar solvents having a boiling point of 160° C. or lower, e.g., methyl ethyl ketone, acetone, and dimethylformamide are preferable, and these solvents are preferably used so that the proportion of the non-volatile matter is 40% to 80% by mass. On the other hand, in the application of adhesive films for build-up, as the organic solvent (C), for example, ketones such as acetone, methyl ethyl ketone, and cyclohexanone; acetic acid esters such as ethyl acetate, butyl acetate, cellosolve acetate, propylene glycol monomethyl ether acetate, and carbitol acetate; cellosolves; carbitols such as butyl carbitol; aromatic hydrocarbons such as toluene and xylene; dimethylformamide; dimethylacetamide; and N-methylpyrrolidone are preferably used. These solvents are preferably used so that the proportion of the non-volatile matter is 30% to 60% by mass.

Furthermore, in order to exhibit flame retardancy, for example, in the field of the printed wiring board, the curable resin composition may contain a non-halogen flame retardant that substantially contains no halogen atoms within the range that does not degrade reliability.

Examples of the non-halogen flame retardant include phosphorus-based flame retardants, nitrogen-based flame retardants, silicone-based flame retardants, inorganic flame retardants, and organic metal salt-based flame retardants. The use of these flame retardants is not limited. These flame retardants may be used alone or a plurality of similar types of flame retardants may be used. Alternatively, different types of flame retardants may be used in combination.

As the phosphorus-based flame retardants, both inorganic compounds and organic compounds can be used. Examples of the inorganic compounds include red phosphorus; ammonium phosphates such as monoammonium phosphate, diammonium phosphate, triammonium phosphate, and ammonium polyphosphate; and inorganic nitrogen-containing phosphorus compounds such as phosphoric acid amide.

The red phosphorus is preferably subjected to a surface treatment in order to prevent hydrolysis or the like. Examples of the process of the surface treatment include (i) a process of coating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a process of coating with a mixture of an inorganic compound such as magnesium hydroxide, aluminum hydroxide, zinc hydroxide, or titanium hydroxide and a thermosetting resin such as a phenolic resin, and (iii) a process of coating with a film composed of an inorganic compound such as magnesium hydroxide, aluminum hydroxide, zinc hydroxide, or titanium hydroxide and further coating the inorganic compound film with a film composed of a thermosetting resin such as a phenolic resin.

Examples of the organic phosphorus-based compound include general-purpose organic phosphorus-based compounds such as phosphate ester compounds, phosphonic acid compounds, phosphinic acid compounds, phosphine oxide compounds, phosphorane compounds, and organic nitrogen-containing phosphorus compounds. Besides these compounds, examples thereof further include cyclic organic phosphorus compounds such as 9,10-dihydro-9-oxa-10-phosphaphenanthrene=10-oxide, 10-(2,5-dihydroxyphenyl)-10H-9-oxa-10-phosphaphenanthrene=10-oxide, and 10-(2,7-dihydroxynaphthyl)-10H-9-oxa-10-phosphaphenanthrene=10-oxide; and derivatives obtained by allowing any of these compounds to react with a compound such as an epoxy resin or a phenolic resin.

The amount of the phosphorus-based flame retardant is appropriately selected in accordance with the type of phosphorus-based flame retardant, other components of the curable resin composition, and the degree of desired flame retardancy. For example, when red phosphorus is used as the non-halogen flame retardant in 100 parts by mass of a curable resin composition containing all components, such as an epoxy resin, a curing agent, a non-halogen flame retardant, and other fillers and additives, red phosphorus is preferably incorporated in an amount in the range of 0.1 to 2.0 parts by mass. When an organic phosphorous compound is used, similarly, the organic phosphorous compound is incorporated in an amount preferably in the range of 0.1 to 10.0 parts by mass, and particularly preferably in the range of 0.5 to 6.0 parts by mass.

When the phosphorous-based flame retardant is used, the phosphorous-based flame retardant may be used in combination with, for example, hydrotalcite, magnesium hydroxide, a boron compounds, zirconium oxide, black dyes, calcium carbonate, zeolite, zinc molybdate, or activated carbon.

Examples of the nitrogen-based flame retardant include triazine compounds, cyanuric acid compounds, isocyanuric acid compounds, and phenothiazine. Triazine compounds, cyanuric acid compounds, and isocyanuric acid compounds are preferable.

Examples of the triazine compound include melamine, acetoguanamine, benzoguanamine, melon, melam, succinoguanamine, ethylenedimelamine, melamine polyphosphate, and triguanamine. Besides these compounds, examples thereof further include (i) aminotriazine sulfate compounds such as guanylmelamine sulfate, melem sulfate, and melam sulfate; (ii) cocondensates of a phenol such as phenol, cresol, xylenol, butylphenol, or nonylphenol, a melamine such as melamine, benzoguanamine, acetoguanamine, or formguanamine, and formaldehyde; (iii) mixtures of the cocondensate (ii) mentioned above and a phenolic resin such as a phenol-formaldehyde condensate; and (iv) those obtained by modifying the cocondensate (ii) or the mixture (iii) with, for example, tung oil or isomerized linseed oil.

Specific examples of the cyanuric acid compound include cyanuric acid and melamine cyanurate.

The amount of the nitrogen-based flame retardant is appropriately selected in accordance with the type of nitrogen-based flame retardant, other components of the curable resin composition, and the degree of desired flame retardancy. For example, the nitrogen-based flame retardant is preferably incorporated within the range of 0.05 to 10 parts by mass, and particularly preferably 0.1 to 5 parts by mass relative to 100 parts by mass of a curable resin composition containing all components, such as an epoxy resin, a curing agent, a non-halogen flame retardant, and other fillers and additives.

When the nitrogen-based flame retardant is used, for example, a metal hydroxide or a molybdenum compound may be used in combination.

The silicone-based flame retardants are not particularly limited so long as the flame retardant is an organic compound having a silicon atom, and examples thereof include silicone oil, silicone rubber, and silicone resins.

The amount of the silicone-based flame retardant is appropriately selected in accordance with the type of silicone-based flame retardant, other components of the curable resin composition, and the degree of desired flame retardancy. For example, the silicone-based flame retardant is preferably incorporated within the range of 0.05 to 20 parts by mass relative to 100 parts by mass of a curable resin composition containing all components, such as an epoxy resin, a curing agent, a non-halogen flame retardant, and other fillers and additives. When the silicone-based flame retardant is used, for example, a molybdenum compound or alumina may be used in combination.

Examples of the inorganic flame retardant include metal hydroxides, metal oxides, metal carbonate compounds, metal powders, boron compounds, and low-melting-point glass.

Specific examples of the metal hydroxide include aluminum hydroxide, magnesium hydroxide, dolomite, hydrotalcite, calcium hydroxide, barium hydroxide, and zirconium hydroxide.

Specific examples of the metal oxide include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Specific examples of the metal carbonate compound include zinc carbonate, magnesium carbonate, calcium carbonate, barium carbonate, basic magnesium carbonate, aluminum carbonate, iron carbonate, cobalt carbonate, and titanium carbonate.

Specific examples of the metal powder include powders of aluminum, iron, titanium, manganese, zinc, molybdenum, cobalt, bismuth, chromium, nickel, copper, tungsten, and tin.

Specific examples of the boron compound include zinc borate, zinc metaborate, barium metaborate, boric acid, and borax.

Specific examples of the low-melting-point glass include Seaplea (Bokusui Brown Co., Ltd.), hydrated glass $SiO_2$—MgO—$H_2O$, PbO—$B_2O_3$-based, ZnO—$P_2O_5$—MgO-based, $P_2O_5$—$B_2O_3$—PbO—MgO-based, P—Sn—O—F-based, PbO—$V_2O_5$—$TeO_2$-based, $Al_2O_3$—$H_2O$-based, and lead borosilicate-based glassy compounds.

The amount of the inorganic flame retardant is appropriately selected in accordance with the type of inorganic flame retardant, other components of the curable resin composition, and the degree of desired flame retardancy. For example, the inorganic flame retardant is preferably incorporated within the range of 0.05 to 20 parts by mass, and particularly preferably from 0.5 to 15 parts by mass relative to 100 parts by mass of a curable resin composition containing all components, such as an epoxy resin, a curing agent, a non-halogen flame retardant, and other fillers and additives.

Examples of the organic metal salt-based flame retardant include ferrocene, acetylacetonate metal complexes, organometallic carbonyl compounds, organic cobalt salt compounds, organic sulfonic acid metal salts, and compounds obtained by ionic bonding or coordinate bonding of a metal atom and an aromatic compound or a heterocyclic compound.

The amount of the organic metal salt-based flame retardant is appropriately selected in accordance with the type of organic metal salt-based flame retardant, other components of the curable resin composition, and the degree of desired flame retardancy. For example, the organic metal salt-based flame retardant is preferably incorporated within the range of 0.005 to 10 parts by mass relative to 100 parts by mass of a curable resin composition containing all components, such as an epoxy resin, a curing agent, a non-halogen flame retardant, and other fillers and additives.

The curable resin composition of the present invention may contain inorganic fillers, if necessary. Examples of the inorganic filler include fused silica, crystalline silica, alumina, silicon nitride, and aluminum hydroxide. When the amount of the inorganic filler is particularly large, fused silica is preferably used. The fused silica can be used in a crushed or spherical form, but it is preferable to mainly use spherical fused silica in order to increase the amount of fused silica blended and to suppress an increase in the melt viscosity of the resulting molding material. In order to further increase the amount of spherical silica blended, it is preferable to appropriately adjust particle size distribution of the spherical silica. In consideration of flame retardancy, the filling ratio of the filler is preferably high and is particularly preferably 20% by mass or more of the total amount of the curable resin composition. When the curable resin composition is used in the application of an electrically conductive paste or the like, an electrically conductive filler such as a silver powder or a copper powder can be used.

Various compounding agents such as a silane coupling agent, a mold release agent, a pigment, and an emulsifier may be optionally added to the curable resin composition of the present invention.

The curable resin composition of the present invention is obtained by uniformly mixing the above-described components. A process of obtaining a cured product of the present invention from the curable resin composition described in detail above may be in accordance with a commonly used curing process of a curable resin composition. The heating temperature condition can be appropriately selected in accordance with the type of curing agent used in combination, the application, and the like. In an example of the process, the curable resin composition of the present invention is heated in the temperature range of about 20° C. to 250° C. Examples of the form of the cured product include a laminate, a cast product, an adhesive layer, a coating film, and a film.

Examples of the applications of the curable resin composition of the present invention include printed wiring board materials, resist ink, electrically conductive pastes, interlayer insulation materials for build-up substrates, adhesive films for build-up, casting resin materials, and adhesives.

Among these various applications, in the applications of a printed wiring board and an adhesive film for build-up, the curable resin composition of the present invention can be used as an insulating material for a so-called electronic component built-in substrate in which a passive component such as a capacitor and an active component such as an integrated circuit (IC) chip are buried in a substrate. Among these, from the standpoint of characteristics such as high heat resistance, low thermal expansion, and solubility in solvents, the curable resin composition of the present invention is preferably used in printed wiring board materials, resist ink, electrically conductive pastes, interlayer insulation materials for build-up substrates, and adhesive films for build-up. In particular, in the present invention, the solubility of the epoxy resin itself in solvents is markedly improved, and furthermore, heat resistance and low thermal expansion are exhibited in cured products of the resin, and thus the curable resin composition is most preferably used for printed wiring board materials.

Here, a printed wiring board of the present invention is obtained by impregnating a reinforcing base material with the above-described varnish-like curable resin composition containing the organic solvent (C), laminating a copper foil, and performing thermocompression bonding. Examples of the reinforcing base material that can be used here include paper, a glass cloth, a glass nonwoven cloth, aramid paper, an aramid cloth, a glass mat, and a glass roving cloth. The process will be further described in detail. First, the above-mentioned varnish-like curable resin composition is heated at a temperature suitable for the type of solvent used, preferably in the range of 50° C. to 170° C. to prepare a prepreg, which is a cured product. Although the mass ratio of the resin composition to the reinforcing base material used in this case is not particularly limited, in general, the content of the resin in the prepreg is preferably adjusted to 20% to 60% by mass. Next, prepregs prepared as described above are laminated by a conventional process, a copper foil is appropriately laminated thereon, and thermocompression bonding is performed at 170° C. to 250° C. under the pressure of 1 to 10 MPa for 10 minutes to 3 hours. Thus, a target printed wiring board can be obtained.

Next, a process for producing, for example, resist ink among the above-mentioned various applications will be described. For example, a cationic polymerization catalyst is used as the curing agent (B) in the curable resin composition, and a pigment, talc, and a filler are added to the composition, thus obtaining target resist ink. As for a process for using this resist ink, the resist ink obtained as described above is applied onto a printed board by a screen printing process, and a resist ink cured product is then formed.

Examples of the process for producing an electrically conductive paste from the curable resin composition of the present invention includes process in which electrically conductive fine particles are dispersed in the curable resin composition to prepare a composition for an anisotropic electrically conductive film, a paste resin composition for connection of circuits, the paste resin composition being a liquid at room temperature, or an anisotropic electrically conductive adhesive.

The above-mentioned interlayer insulation material for a build-up substrate can be obtained by appropriately blending a rubber, a filler, and the like with the curable resin composition described above. In order to produce a build-up substrate using this material, first, the curable resin composition is applied onto a wiring board having circuits thereon by a spray coating process, a curtain coating process, or the like, and is then cured. Subsequently, predetermined through-hole portions and the like are formed if necessary. The resulting wiring board is then treated with a roughening agent, and the surface thereof is washed with hot water, thereby forming irregularities. The surface is then plated with a metal such as copper. The plating process is preferably an electroless plating or electrolytic plating treatment. Examples of the roughening agent include an oxidizing agent, an alkali, and an organic solvent. This operation is sequentially repeated according to need, and a resin insulating layer and an electrically conductive layer of a predetermined circuit pattern are formed so that the layers are alternately built up. Thus, a build-up substrate can be obtained. However, the formation of the through-hole portions is performed after the outermost resin insulating layer is formed. Alternatively, it is also possible to produce a build-up substrate by compression-bonding a copper foil coated with a resin obtained semi-curing the resin composition on a wiring board having circuits thereon under heating at 170° C. to 250° C. without conducting the steps of forming a roughened surface and performing a plating treatment.

A process for producing an adhesive film for build-up from the curable resin composition of the present invention is as follows. For example, the curable resin composition of the present invention is applied onto a support film to form a resin composition layer, and the resulting film is used as an adhesive film for a multi-layer printed wiring board.

When the curable resin composition of the present invention is used in an adhesive film for build-up, it is important that the adhesive film be softened under the temperature condition (usually 70° C. to 140° C.) of the lamination in a vacuum lamination process, and exhibit fluidity (resin flow) sufficient for filling a via hole or a through-hole present in a circuit board with the resin at the same time of the lamination of the circuit board. It is preferable to blend the above-mentioned components so that the adhesive film exhibits such properties.

Here, the diameter of a through-hole of a multi-layer printed wiring board is usually 0.1 to 0.5 mm and the depth thereof is usually 0.1 to 1.2 mm. Usually, it is preferable that the resin can be filled within these ranges. Note that when lamination is performed on both surfaces of a circuit board, it is desirable to fill about ½ of a through-hole.

Specifically, the above-described adhesive film can be produced as follows. A varnish-like curable resin composition of the present invention is prepared, and this varnish-like composition is then applied onto a surface of a support film (Y). Furthermore, an organic solvent is dried by heating, blowing a hot wind, or the like to form a layer (X) of the curable resin composition.

The thickness of the layer (X) formed is usually equal to or larger than the thickness of an electrically conductive layer. Since the thickness of an electrically conductive layer of a circuit board is usually in the range of 5 to 70 μm, the layer of the resin composition preferably has a thickness in the range of 10 to 100 μm.

Note that the layer (X) in the present invention may be protected with a protective film described below. By protecting with the protective film, it is possible to prevent adhesion of contaminations and the like and formation of scratches on the surface of the layer of the resin composition.

Examples of the above-mentioned support film and the protective film include polyolefins such as polyethylene, polypropylene, and polyvinyl chloride; polyesters such as polyethylene terephthalate (hereinafter may be abbreviated as "PET") and polyethylene naphthalate; polycarbonates; polyimides; release paper; and metal foils such as a copper foil and an aluminum foil. Note that the support film and the protective film may be subjected to a release treatment besides a mat treatment or a corona treatment.

The thickness of the support film is not particularly limited, but is usually in the range of 10 to 150 μm, and preferably in the range of 25 to 50 μm. The thickness of the protective film is preferably in the range of 1 to 40 μm.

The above-described support film (Y) is detached after the adhesive film is laminated on a circuit board or after an insulating layer is formed by heat curing. When the support film (Y) is detached after the adhesive film is cured by heating, it is possible to prevent adhesion of contamination and the like in the curing step. In the case where the support film (Y) is detached after the curing, a release treatment is usually performed on the support film in advance.

Next, a process for producing a multi-layer printed wiring board using the adhesive film obtained as described above will be described. For example, when the layer (X) is protected with a protected film, the protective film is detached, and the layer (X) is then laminated on one surface or each surface of a circuit board so as to directly contact the circuit board by, for example, a vacuum lamination process. The process of lamination may be a batch process or a continuous process using a roll. Before the lamination, the adhesive film and the circuit board may be heated (preheated) if necessary.

As for the conditions for the lamination, the compression-bonding temperature (lamination temperature) is preferably set to 70° C. to 140° C., and pressure during the compression bonding is preferably set to 1 to 11 kgf/cm$^2$ (9.8×10$^4$ to 107.9×10$^4$ N/m$^2$), and the lamination is preferably performed under reduced pressure, specifically, an air pressure of 20 mmHg (26.7 hPa) or less.

EXAMPLES

Next, the present invention will be specifically described by way of Examples and Comparative Examples. In the description below, the "part" and "%" are based on the mass unless otherwise stated. Note that the melt viscosity at 150° C., and GPC, NMR, and MS spectra were measured under the following conditions.
1) Melt viscosity at 150° C.: In accordance with ASTM D4287
2) Method for measuring softening point: JIS K7234
3) GPC: The measurement conditions were as follows:
  Measuring apparatus: "HLC-8220 GPC" produced by Tosoh Corporation
  Columns: Guard column "H$_{XL}$-L" produced by Tosoh Corporation
  "TSK-GEL G2000HXL" produced by Tosoh Corporation
  "TSK-GEL G2000HXL" produced by Tosoh Corporation
  "TSK-GEL G3000HXL" produced by Tosoh Corporation
  "TSK-GEL G4000HXL" produced by Tosoh Corporation
  Detector: RI (differential refractometer)
  Data processing: "GPC-8020 model II Version 4.10" produced by Tosoh Corporation
  Measurement Conditions:

| | |
|---|---|
| Column temperature | 40° C. |
| Developing solvent | Tetrahydrofuran |
| Flow rate | 1.0 mL/min. |

Standard: In accordance with a measurement manual of the "GPC-8020 model II Version 4.10", the following monodisperse polystyrenes having known molecular weights were used.
  (Polystyrenes used)
  "A-500" produced by Tosoh Corporation
  "A-1000" produced by Tosoh Corporation
  "A-2500" produced by Tosoh Corporation
  "A-5000" produced by Tosoh Corporation
  "F-1" produced by Tosoh Corporation
  "F-2" produced by Tosoh Corporation
  "F-4" produced by Tosoh Corporation
  "F-10" produced by Tosoh Corporation
  "F-20" produced by Tosoh Corporation
  "F-40" produced by Tosoh Corporation
  "F-80" produced by Tosoh Corporation
  "F-128" produced by Tosoh Corporation
  Sample: Each sample (50 μL) was prepared by filtering a 1.0% by mass tetrahydrofuran solution in terms of resin solid content with a microfilter.
4) NMR: NMR GSX270 produced by JEOL Ltd.
5) MS: Double-focusing mass spectrometer ΔX505H (FD505H) produced by JEOL Ltd.

Example 1

Figure 2:
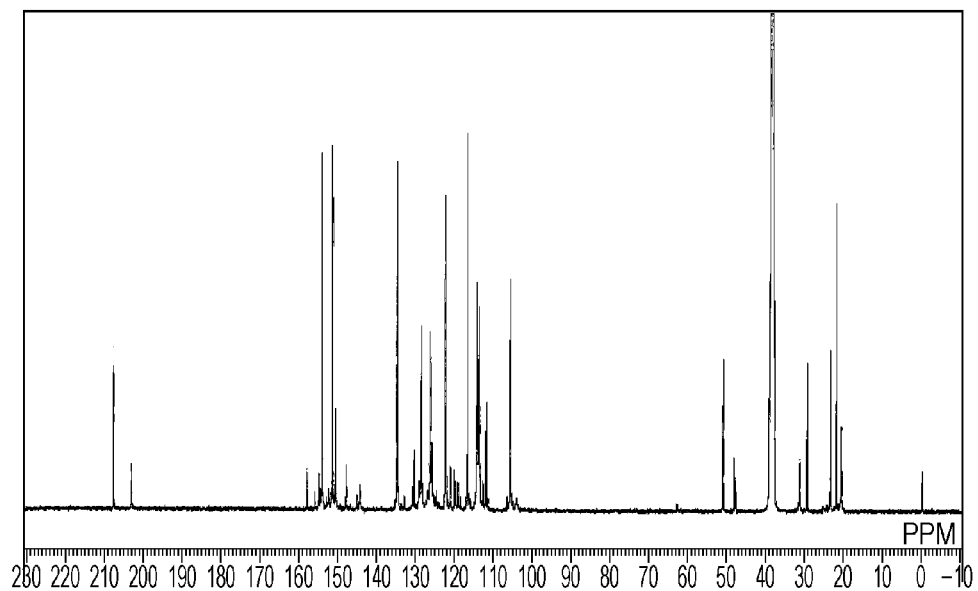
FIG. 2 is a $^{13}$C-NMR spectrum of the phenolic compound obtained in Example 1.
Figure 3:
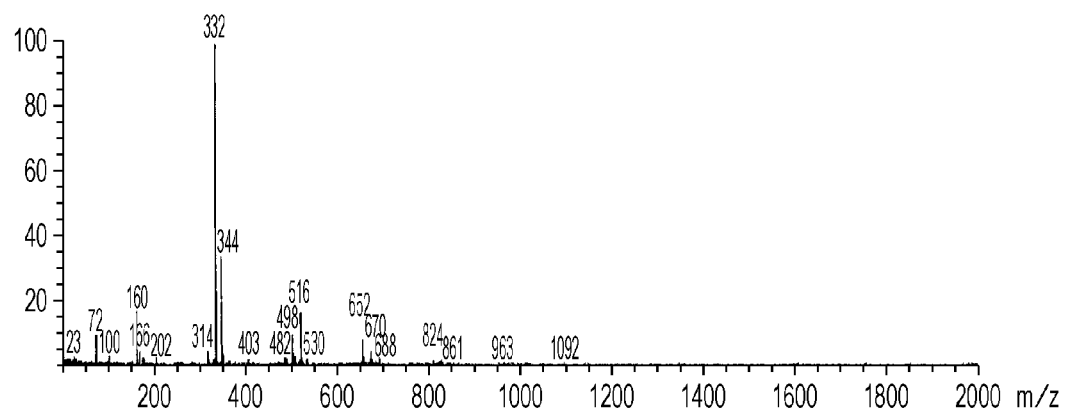
FIG. 3 is a mass spectrum of the phenolic compound obtained in Example 1.

To a flask equipped with a thermometer, a dropping funnel, a condenser, a distilling tube, and a stirrer, 240 parts (1.50 moles) of 2,7-dihydroxynaphthalene, 85 parts (1.05 moles) of a 37% by mass aqueous formaldehyde solution, 376 parts of isopropyl alcohol, and 88 parts (0.75 moles) of a 48% aqueous potassium hydroxide solution were charged, and the mixture was stirred at room temperature while blowing nitrogen. Subsequently, the temperature was increased to 75° C., and stirring was conducted for two hours. After the completion of the reaction, 108 parts of sodium dihydrogen phosphate was added to neutralize the reaction solution. Isopropyl alcohol was then removed under reduced pressure, and 480 parts of methyl isobutyl ketone was added thereto. The resulting organic layer was repeatedly washed with 200 parts of water three times, and methyl isobutyl ketone was then removed by heating under reduced pressure. Thus, 245 parts of a phenolic compound (A-1) was obtained. The phenolic compound (A-1) had a hydroxyl equivalent of 84 g/eq. FIG. 1 shows a GPC chart of the prepared phenolic compound, FIG. 2 shows a $^{13}$C-NMR chart thereof, and FIG. 3 shows a MS spectrum thereof. Referring to the $^{13}$C-NMR chart, a peak showing the generation of a carbonyl group was detected near 203 ppm. In addition, referring to the MS spectrum, a peak of 344 showing a raw material phenol represented by a structural formula below:

[Chem. 15]

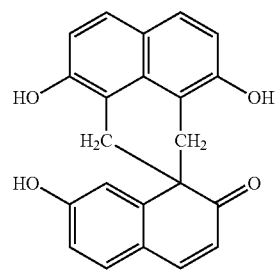

was detected.

Figure 4:
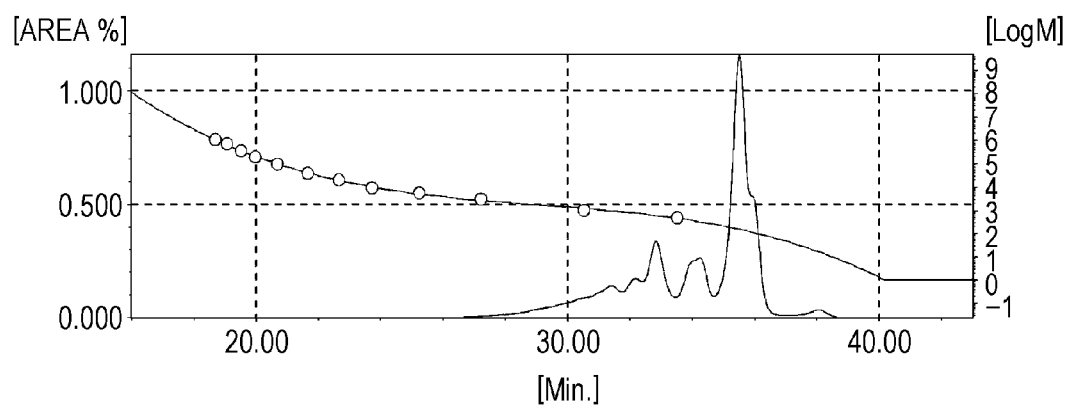
FIG. 4 is a GPC chart of an epoxy resin obtained in Example 1.
Figure 5:
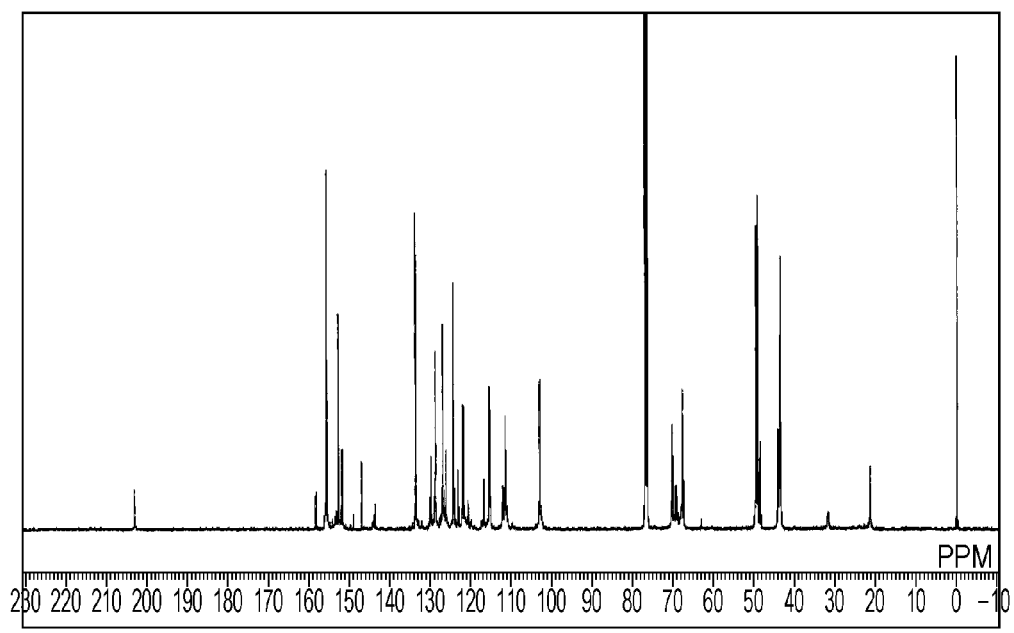
FIG. 5 is a $^{13}$C-NMR spectrum of the epoxy resin obtained in Example 1.
Figure 6:
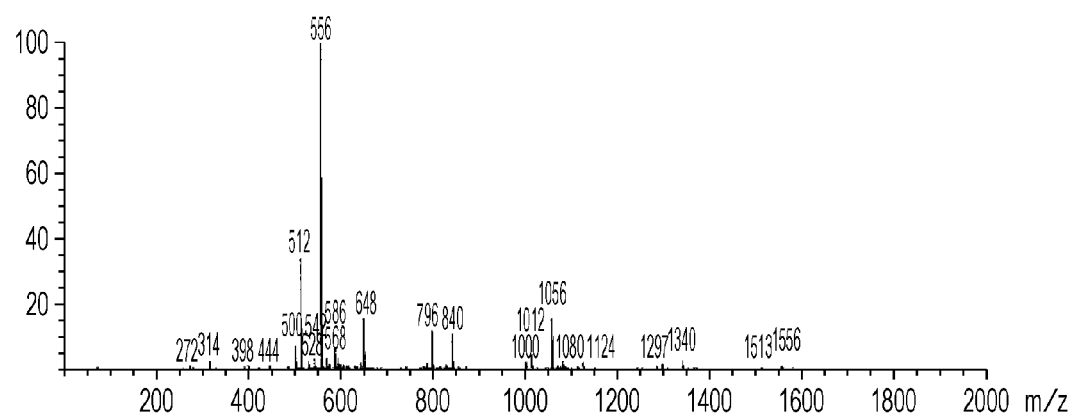
FIG. 6 is a mass spectrum of the epoxy resin obtained in Example 1.

Subsequently, 84 parts (hydroxyl group 1.0 equivalent) of the phenolic compound (A-1) obtained by the above reaction, 463 parts (5.0 moles) of epichlorohydrin, and 53 parts of n-butanol were charged to a flask equipped with a thermometer, a condenser, and a stirrer while purging nitrogen gas to dissolve the compound. The temperature was increased to 50° C., and 220 parts (1.10 moles) of a 20% aqueous sodium hydroxide solution was then added to the resulting solution over a period of three hours. Subsequently, the solution was further allowed to react at 50° C. for one hour. After the completion of the reaction, unreacted epichlorohydrin was distilled off at 150° C. under reduced pressure. Subsequently, 300 parts of methyl isobutyl ketone and 50 parts of n-butanol were added to the crude epoxy resin thus obtained to dissolve the crude epoxy resin. Furthermore, 15 parts of a 10% by mass aqueous sodium hydroxide solution was added to the solution, and was allowed to react at 80° C. for two hours. Subsequently, washing with 100 parts of water was repeated three times until the pH of the washed liquid became neutral. Next, the inside of the system was dehydrated by azeotrope, and microfiltration was performed. Subsequently, the solvent was distilled off under reduced pressure to obtain 126 parts of a target epoxy resin (A-2). The prepared epoxy resin (A-2) had a softening point of 95° C. (B&R process), a melt viscosity of 9.0 dPa·s (measuring process: ICI viscometer process, measurement temperature: 150° C.), and an epoxy equivalent of 170 g/eq. FIG. 4 shows a GPC chart of the prepared epoxy resin, FIG. 5 shows a $^{13}$C-NMR chart thereof, and FIG. 6 shows a MS spectrum thereof. Referring to the $^{13}$C-NMR chart, a peak showing the generation of a carbonyl group was detected near 203 ppm. In addition, referring to the MS spectrum, a peak of 512 showing structural formula (i-α) below:

[Chem. 16]

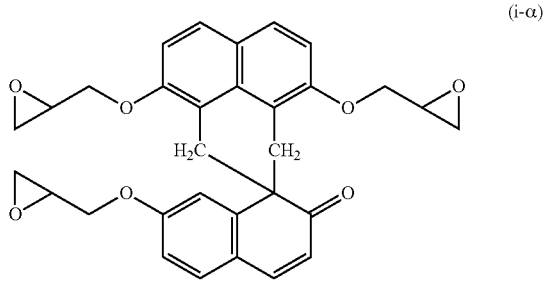

(i-α)

was detected.

In addition, the epoxy resin (A-2) contained 10.5% by mass of the compound represented by structural formula (i-α) above, 39.6% by mass of a compound represented by structural formula (i-β) below:

[Chem. 17]

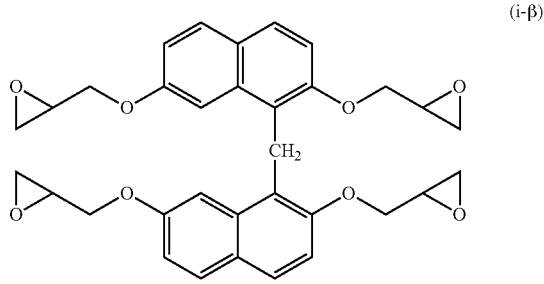

(i-β)

and 49.9% by mass of other oligomer components.

Example 2

Figure 7:
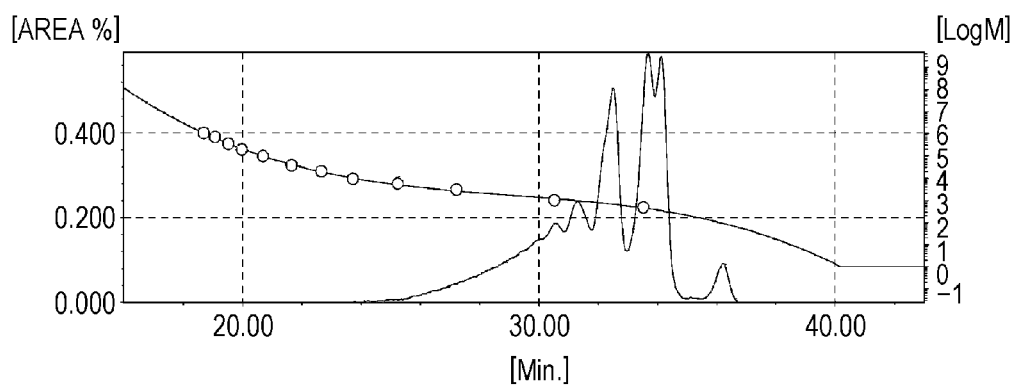
FIG. 7 is a GPC chart of an epoxy resin obtained in Example 2.
Figure 8:
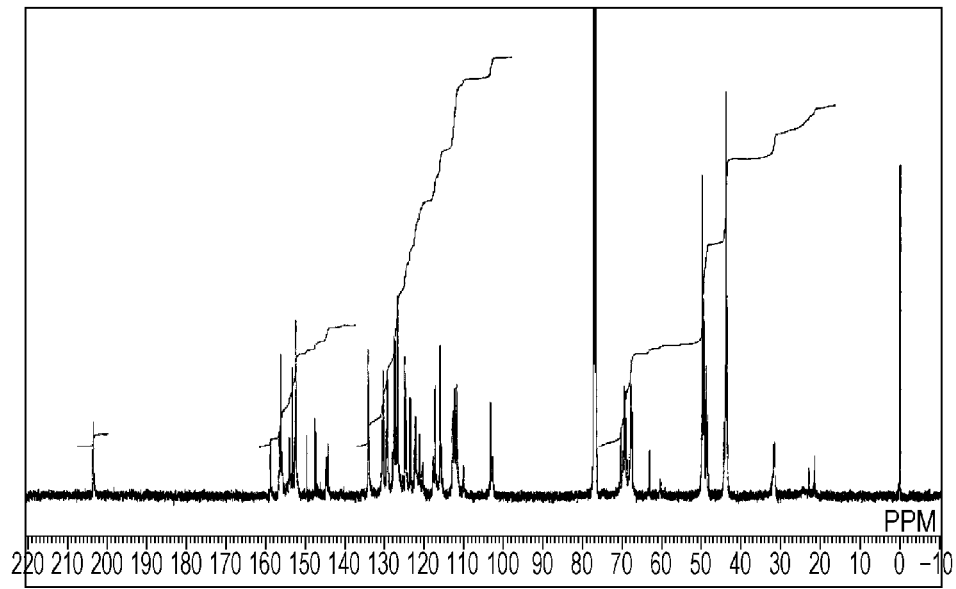
FIG. 8 is a $^{13}$C-NMR spectrum of the epoxy resin obtained in Example 2.
Figure 9:
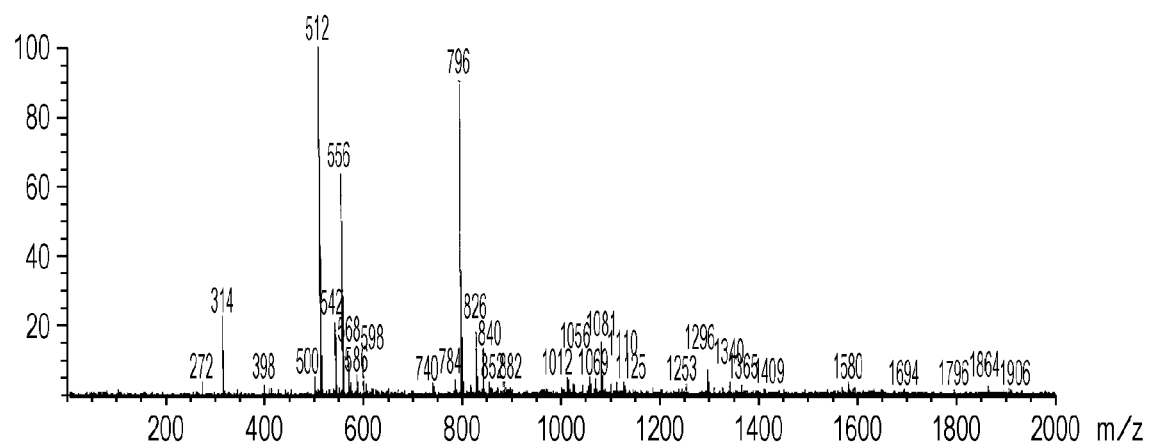
FIG. 9 is a mass spectrum of the epoxy resin obtained in Example 2.

A target epoxy resin (A-3) (128 parts) was obtained as in Example 1 except that the amount of 37% aqueous formaldehyde solution was changed to 122 parts (1.50 moles). The prepared epoxy resin (A-3) had a softening point of 98° C. (B&R process), a melt viscosity of 18.0 dPa·s (measuring process: ICI viscometer process, measurement temperature: 150° C.), and an epoxy equivalent of 178 g/eq. FIG. 7 shows a GPC chart of the prepared epoxy resin, FIG. 8 shows a $^{13}$C-NMR chart thereof, and FIG. 9 shows a MS spectrum thereof. Referring to the $^{13}$C-NMR chart, a peak showing the generation of a carbonyl group was detected near 203 ppm. In addition, referring to the MS spectrum, a peak of 512 showing structural formula (i-α) above was detected.

In addition, the epoxy resin (A-3) contained 15.5% by mass of the compound represented by structural formula (i-α) above, 20.7% by mass of the compound represented by structural formula (i-β) above, and 63.8% by mass of other oligomer components.

Examples 3 and 4 and Comparative Example 1

The epoxy resin (A-2), the epoxy resin (A-3), and an epoxy resin (A-4) for comparison [tetrafunctional naphthalene epoxy resin represented by structural formula below:

[Chem. 18]

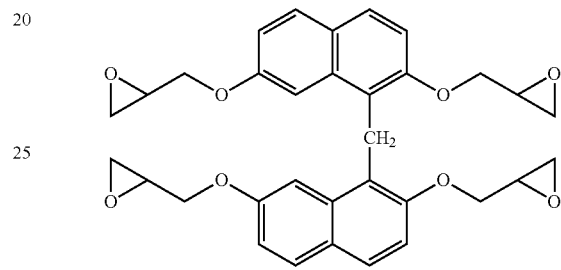

("EPICLON HP-4700" produced by DIC Corporation, epoxy equivalent 165 g/eq)], all of which function as epoxy resins, a phenol novolac-type phenolic resin ("TD-2131" produced by DIC Corporation, hydroxyl equivalent 104 g/eq) functioning as a curing agent, and triphenylphosphine (TPP) functioning as a curing accelerator were used and blended so as to have the compositions shown in Table 1. Each of the resulting resin compositions was cast in a mold having dimensions of 11 cm×9 cm×2.4 mm, and was molded by pressing at a temperature of 150° C. for 10 minutes. The resulting molded product was then taken out from the mold, and then post-cured at a temperature of 175° C. for five hours. Thus, samples were prepared. Heat resistance and the coefficient of linear expansion were evaluated. Furthermore, the solubility of the epoxy resin (A-2), the epoxy resin (A-3), and the epoxy resin (A-4) in a solvent was measured by the process described below. Table 1 shows the results.

<Heat Resistance (Glass Transition Temperature)>

A temperature at which a change in the modulus of elasticity became maximum (the rate of change in tan δ was the largest) was evaluated as the glass transition temperature using a viscoelasticity measuring apparatus (DMA: solid viscoelasticity measuring apparatus RSA-II produced by Rheometric Scientific Inc., rectangular tension mode; frequency 1 Hz, temperature-increasing rate 3° C./min).

<Coefficient of Linear Expansion>

Thermomechanical analysis was conducted using a thermomechanical analyzer (TMA: SS-6100 manufactured by Seiko Instruments Inc.) in a compression mode.

Measurement conditions

Measuring load: 88.8 mN

Temperature-increasing rate: Twice at 3° C./min

Measurement temperature range: −50° C. to 300° C.

The measurement under the above conditions was conducted twice for the same sample. An average coefficient of expansion in the temperature range of 25° C. to 280° C. in the second measurement was evaluated as the coefficient of linear expansion.

<Solubility in Solvent>

In a sample bottle, 10 parts of an epoxy resin was dissolved in 4.3 parts of methyl ethyl ketone at 60° C. in a sealed state. Subsequently, the solution was cooled to 25° C. and whether crystals were precipitated or not was evaluated. When no crystals were precipitated, the sample was evaluated as "good". When crystals were precipitated, the sample was evaluated as "poor".

TABLE 1

|  |  | Example 3 | Example 4 | Comparative Example 1 |
|---|---|---|---|---|
| Epoxy resin | A-2 | 62.0 |  |  |
|  | A-3 |  | 63.1 |  |
|  | A-4 |  |  | 61.3 |
| Curing agent | TD-2131 | 38 | 36.9 | 38.7 |
| TPP |  | 1 | 1 | 1 |
| Heat resistance (° C.) |  | 253 | 264 | 235 |
| Coefficient of linear expansion (ppm) |  | 83 | 71 | 90 |
| Solubility in solvent |  | Good | Good | Poor |

Example 5 and Comparative Example 2

In accordance with the compositions shown in Table 2 below, an epoxy resin, a phenol novolac-type phenolic resin ("TD-2090" produced by DIC Corporation, hydroxyl equivalent 105 g/eq) functioning as a curing agent, and 2-ethyl-4-methylimidazole (2E4MZ) functioning as a curing accelerator were blended, and methyl ethyl ketone was blended so that the non-volatile matter (N.V.) of each composition was finally adjusted to 58% by mass.

Subsequently, each of the compositions was cured under the conditions below to experimentally produce a laminate, and heat resistance and the coefficient of thermal expansion were evaluated by the process described below. Table 2 shows the results.

<Conditions for Preparation of Laminate>

Base material: Glass cloth "#2116" (210×280 mm) produced by Nitto Boseki Co., Ltd.

The number of plys: 6, Conditions for forming prepreg: 160° C.

Curing condition: 1.5 hours at 200° C. and 40 kg/cm², Sheet thickness after forming: 0.8 mm <Heat Resistance (Glass Transition Temperature)>

The laminate was cut out to have a size of 5 mm×54 mm×0.8 mm, and this was used as a test specimen. A temperature at which a change in the modulus of elasticity became maximum (the rate of change in tan δ was the largest) was evaluated as the glass transition temperature using a viscoelasticity measuring apparatus (DMA: solid viscoelasticity measuring apparatus "RSA-II" produced by Rheometric Scientific Inc., rectangular tension mode: frequency 1 Hz, temperature-increasing rate 3° C./min).

<Coefficient of Linear Expansion>

The laminate was cut out to have a size of 5 mm×5 mm×0.8 mm, and this was used as a test specimen. Thermomechanical analysis was conducted using a thermomechanical analyzer (TMA: SS-6100 manufactured by Seiko Instruments Inc.) in a compression mode.

Measurement conditions
Measuring load: 88.8 mN

Temperature-increasing rate: Twice at 3° C./min
Measurement temperature range: −50° C. to 300° C.

The measurement under the above conditions was conducted twice for the same sample. An average coefficient of expansion in the temperature range of 240° C. to 280° C. in the second measurement was evaluated as the coefficient of linear expansion.

TABLE 2

|  |  | Example 5 | Comparative Example 2 |
|---|---|---|---|
| Epoxy resin | A-2 | 61.8 |  |
|  | A-4 |  | 61.1 |
| Curing agent | TD-2090 | 38.2 | 38.9 |
| 2E4MZ |  | 0.05 | 0.075 |
| Heat resistance (° C.) |  | 266 | 200 |
| Coefficient of linear expansion (ppm) |  | 204 | 283 |

The invention claimed is:

1. A curable resin composition comprising, as essential components, an epoxy resin (A) having, in its molecular structure, a glycidyloxy group and a skeleton in which a naphthalene structure and a cyclohexadienone structure are bonded to each other via methylene group(s); and a curing agent (B).

2. The curable resin composition according to claim 1, wherein the cyclohexadienone structure present in the molecular structure of the epoxy resin (A) is a 2-naphthalenone structure.

3. The curable resin composition according to claim 2, wherein the epoxy resin (A) contains a compound (a) having a skeleton represented by structural formula (i) below:

[Chem. 1]

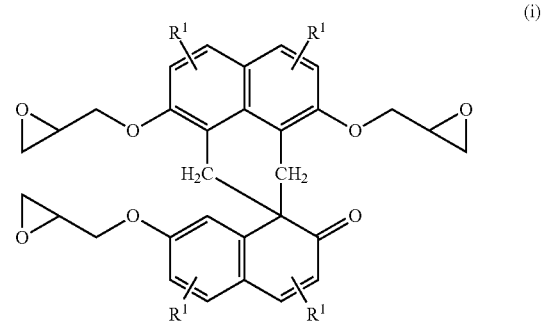

(i)

(wherein $R^1$s each independently represent a hydrogen atom, a hydrocarbon group having 1 to 4 carbon atoms, or an alkoxy group having 1 to 2 carbon atoms.

4. The curable resin composition according to claim 3, wherein the epoxy resin (A) has an epoxy equivalent of 150 to 300 g/eq.

5. The curable resin composition according to claim 2, wherein the epoxy resin (A) has a molecular structure obtained by allowing a 2,7-dihydroxynaphthalene type compound to react with formaldehyde in the presence of an alkali catalyst in an amount 0.2 to 2.0 times the 2,7-dihydroxynaphthalene type compound on a molar basis, and then allowing an epihalohydrin to react with the resulting reaction product.

6. A cured product obtained by conducting a curing reaction of the curable resin composition according to claim 1.

7. A printed wiring board obtained by impregnating a reinforcing base material with a varnish-like resin composition prepared by further blending an organic solvent (C) with the composition according to claim 1, laminating a copper foil, and performing thermocompression bonding.

8. An epoxy resin comprising, in its molecular structure, a glycidyloxy group and a skeleton in which a naphthalene structure and a cyclohexadienone structure are bonded to each other via methylene group(s).

9. The epoxy resin according to claim 8, wherein the epoxy resin has a structural formula (i) below:

[Chem. 2]

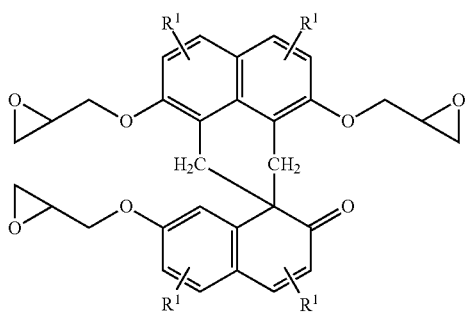

(i)

(wherein $R^1$s each independently represent a hydrogen atom, a hydrocarbon group having 1 to 4 carbon atoms, or an alkoxy group having 1 to 2 carbon atoms.

10. An epoxy resin comprising a molecular structure obtained by allowing a 2,7-dihydroxynaphthalene type compound to react with formaldehyde in the presence of an alkali catalyst in an amount 0.2 to 2.0 times the 2,7-dihydroxynaphthalene type compound on a molar basis, and then allowing an epihalohydrin to react with the resulting reaction product.

11. A cured product obtained by conducting a curing reaction of the curable resin composition according to claim 2.

12. A cured product obtained by conducting a curing reaction of the curable resin composition according to claim 3.

13. A cured product obtained by conducting a curing reaction of the curable resin composition according to claim 4.

14. A cured product obtained by conducting a curing reaction of the curable resin composition according to claim 5.

15. A printed wiring board obtained by impregnating a reinforcing base material with a varnish-like resin composition prepared by further blending an organic solvent (C) with the composition according to claim 2, laminating a copper foil, and performing thermocompression bonding.

16. A printed wiring board obtained by impregnating a reinforcing base material with a varnish-like resin composition prepared by further blending an organic solvent (C) with the composition according to claim 3, laminating a copper foil, and performing thermocompression bonding.

17. A printed wiring board obtained by impregnating a reinforcing base material with a varnish-like resin composition prepared by further blending an organic solvent (C) with the composition according to claim 4, laminating a copper foil, and performing thermocompression bonding.

18. A printed wiring board obtained by impregnating a reinforcing base material with a varnish-like resin composition prepared by further blending an organic solvent (C) with the composition according to claim 5, laminating a copper foil, and performing thermocompression bonding.

* * * * *